(12) United States Patent
Vyas et al.

(10) Patent No.: US 7,550,222 B2
(45) Date of Patent: Jun. 23, 2009

(54) FUEL CELL COMPONENT HAVING A DURABLE CONDUCTIVE AND HYDROPHILIC COATING

(75) Inventors: Gayatri Vyas, Rochester Hills, MI (US); Thomas A. Trabold, Pittsford, NY (US); Mahmoud H. Abd Elhamid, Grosse Pointe Woods, MI (US); Youssef M. Mikhail, Sterling Heights, MI (US); Roy Gordon, Cambridge, MA (US); Dawen Pang, Brighton, MA (US)

(73) Assignee: GM Global Technology Operations, Inc., Detroit, MI (US)

( * ) Notice: Subject to any disclaimer, the term of this patent is extended or adjusted under 35 U.S.C. 154(b) by 0 days.

(21) Appl. No.: 11/536,061

(22) Filed: Sep. 28, 2006

(65) Prior Publication Data

US 2007/0092780 A1    Apr. 26, 2007

Related U.S. Application Data

(60) Provisional application No. 60/728,962, filed on Oct. 21, 2005.

(51) Int. Cl.
*H01M 2/00* (2006.01)
*H01M 2/14* (2006.01)

(52) U.S. Cl. .............................. 429/34; 429/38; 429/39

(58) Field of Classification Search ................ 427/115, 427/126.1
See application file for complete search history.

(56) References Cited

U.S. PATENT DOCUMENTS

| | | | |
|---|---|---|---|
| 4,756,791 A * | 7/1988 | D'Angelo et al. ............. 117/87 |
| 5,194,642 A * | 3/1993 | Winter et al. ................. 556/51 |
| 5,258,204 A * | 11/1993 | Wernberg et al. ....... 427/255.19 |
| 5,624,769 A | 4/1997 | Li et al. |
| 5,798,188 A * | 8/1998 | Mukohyama et al. ......... 429/34 |
| 5,980,977 A | 11/1999 | Deng et al. |
| 6,238,734 B1 * | 5/2001 | Senzaki et al. ............. 427/226 |
| 6,617,057 B2 * | 9/2003 | Gorokhovsky et al. ...... 428/698 |
| 6,811,918 B2 | 11/2004 | Blunk et al. |
| 6,893,765 B1 * | 5/2005 | Nishida et al. ................ 429/34 |
| 2004/0070017 A1 * | 4/2004 | Yang et al. .................. 257/296 |
| 2004/0241490 A1 * | 12/2004 | Finley ........................ 428/655 |
| 2005/0181264 A1 * | 8/2005 | Gu et al. ....................... 429/38 |
| 2006/0216571 A1 | 9/2006 | Vyas et al. |
| 2006/0277767 A1 * | 12/2006 | Sun et al. .................. 30/346.54 |
| 2006/0280992 A1 * | 12/2006 | Miyagawa ................... 429/34 |

FOREIGN PATENT DOCUMENTS

| | | |
|---|---|---|
| CN | 1373912 | 10/2002 |
| WO | WO 2006/014403 | 2/2006 |

OTHER PUBLICATIONS

Hong Xiao, Introduction to Semiconductor Manufacturing Technology, Prentice Hall, 2001, pp. 496-497, Upper Saddle River, New Jersey.
A. Jouaiti et al, Corrosion Behaviour of TiN0.8O0.4 Coating on 316L Stainless Steel Alloy, J. Chem. Research 2003, 786-788.
European Search Report, Application No. 06 021 979.7 dated Oct. 15, 2008, Applicant: GM Global Technology Operations, Inc., 3 pages.

* cited by examiner

*Primary Examiner*—Dah-Wei D Yuan
*Assistant Examiner*—Alexander Chuang

(57) ABSTRACT

A fuel cell component having a coating thereon including binary and ternary nitrides and oxynitrides of elements of IVb and Vb groups of the periodic table of elements.

8 Claims, 4 Drawing Sheets

_US 7,550,222 B2_

FUEL CELL COMPONENT HAVING A DURABLE CONDUCTIVE AND HYDROPHILIC COATING

CROSS-REFERENCE TO RELATED APPLICATIONS

This application claims the benefit of U.S. Provisional Application No. 60/728,962, filed Oct. 21, 2005.

TECHNICAL FIELD

The field to which the disclosure generally relates includes fuel cell components, and more particularly, to fuel cell components having a protective electrically conductive and hydrophilic coating.

BACKGROUND

The use of coated and/or uncoated metal bipolar plates are a viable path because the thin nature of the metal substrate allows for smaller stack designs with reduced weight. Also, the simplicity of stamping a flow field into the metal is a very attractive feature of metal design. From the cost perspective also, metal bipolar plates are relatively inexpensive.

Metal bipolar plates are a subject of corrosion during the fuel cell operation, mainly because of the fluoride ions released as a product of membrane degradation, which makes the implementation of metal plates difficult. Anode plates have shown metal dissolution resulting in the release of Fe, Cr and Ni ions, which impair the proton conductivity of the membrane and can contribute to its chemical degradation. The cathode plate is covered with oxide film, which causes high electrical contact resistance with gas diffusion medium used to distribute the reactive gases to the catalyst layers on MEA. A suppression of aforementioned corrosion and electrical contact resistance processes plays an important role for fuel cell implementation.

Common non-precious corrosion-resistant materials, which are used for protective coatings are Ti, Ta, Nb, Cr, etc. These metal maintain corrosion resistance because of the existence of protective passive layers on their surfaces, however their passive oxides are generally non-conductive oxide films which normally have a high electrical contact resistance with the gas diffusion medium. Moreover, some of these materials undergo severe corrosion under the specific fuel cell operation conditions. Precious noble metal coatings are viable solutions but such coatings are prohibitively expensive.

It is also desirable for the metal bipolar plate materials to have a low water contact angle at the bipolar plate/water border. However, the water contact angles at the precious metal/water interface are not small enough (for example, $\Theta_{Pt}^{water} \sim 70°$, $\Theta_{Au}^{water} \sim 40°$, etc.). The discovery of non-precious corrosion-resistant and highly conductive bipolar plate coatings are desirable for a viable fuel cell for vehicles. Titanium nitride coatings have been disclosed as one of such corrosion resistant plating in U.S. Pat. No. 5,624,769. Whereas titanium nitride is cost effective, stable material under fuel cell operating conditions are also conductive, it does not provide satisfactory protection for bipolar plate material because its film is porous and thus permeable to corroding agents. Also, this coating develops relatively high water affinity, with contact angle close to 60°.

SUMMARY OF EXEMPLARY EMBODIMENTS OF THE INVENTION

One embodiment of the invention includes a fuel cell component having a coating thereon including binary and ternary nitrides and oxynitrides of elements of IVb and Vb groups. In one embodiment the fuel cell component is a bipolar plate.

Other embodiments of the invention include fuel cell components with coating thereon including TiZrN, NbTiN, and TaZrN and oxynitrides including $NbTiO_xN_y$, $TiZrO_xN_y$, and $TaZrO_xN_y$, where $0.001 \leq x \leq 1$, and $0.1 \leq y \leq 2$.

Other exemplary embodiments of the present invention will become apparent from the detailed description provided hereinafter. It should be understood that the detailed description and specific examples, while disclosing exemplary embodiments of the invention, are intended for purposes of illustration only and are not intended to limit the scope of the invention.

BRIEF DESCRIPTION OF THE DRAWINGS

Exemplary embodiments of the present invention will become more fully understood from the detailed description and the accompanying drawings, wherein.

DETAILED DESCRIPTION OF EXEMPLARY EMBODIMENTS

The following description of the embodiment(s) is merely exemplary in nature and is in no way intended to limit the invention, its application, or uses.

One embodiment of the invention includes a fuel cell component having a coating thereon including binary and ternary nitrides and oxynitrides of elements of IVb and Vb groups of the periodic table of elements, such as Ti, Zr, V, Nb, Ta. All of the nitrides and oxynitrides of IVb and Vb group elements are relatively stable under fuel cell operating conditions and have a high intrinsic conductivity or can be made conductive with appropriate metal doping. As a rule, these oxynitrides and nitrides formed have similar crystal structure and electronic properties as their binary constituents. Other embodiments of the invention include fuel components with coating thereon including TiZrN, NbTiN, and TaZrN and oxynitrides including $NbTiO_xN_y$, $TiZrO_xN_y$, and $TaZrO_xN_y$, where $0.001 \leq x \leq 1$, and $0.1 \leq y \leq 2$. These mixed nitrides and mixed oxynitrides formed have corrosion resistance that is superior to those of the constituting binary constituents and their conductivity may be estimated as a superposition of conductivities of the constituting nitrides. In one embodiment of the invention, the fuel cell component is a bipolar plate.

Figure 1:
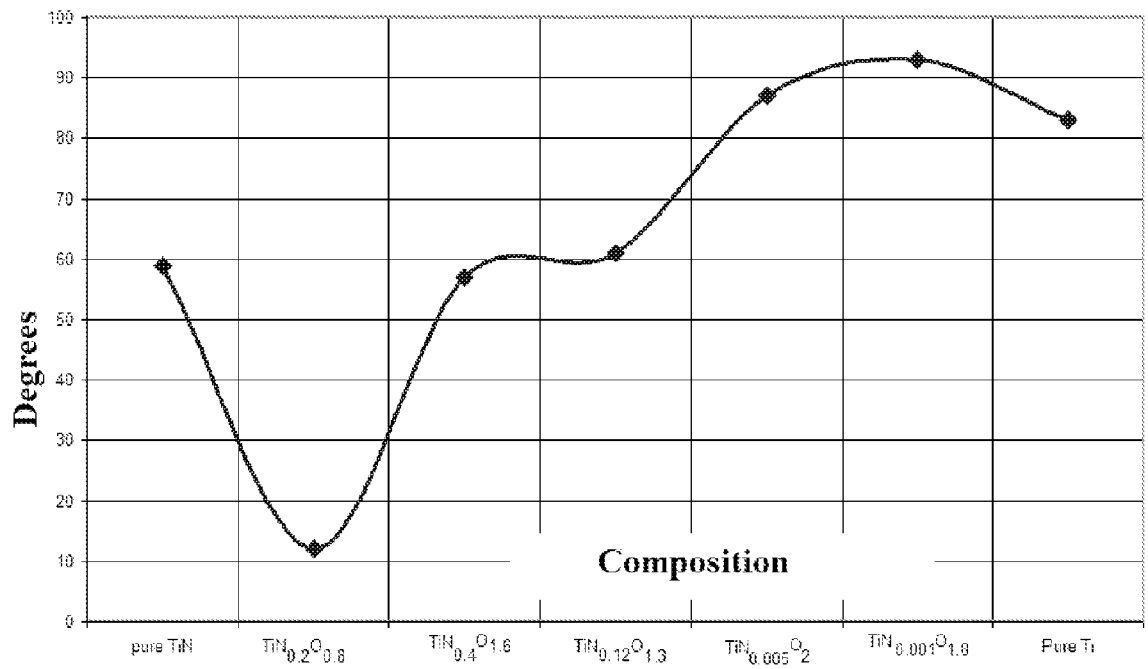
FIG. 1 is a graphical comparison of the electrical contact resistance measured on Ti oxynitride coating with other coatings.

Electrical contact resistance measured for a mixed mixed-oxynitride $TiO_2.Nb$: TiNNb prepared at Harvard Labs are shown in FIG. 1. As can be observed that such coatings have shown contact resistance values similar or even lower than 10 nm Au. In FIG. 1, Sample 1 is $TiO_2.Nb$: TiNNb, Sample 2 is also $TiO_2.Nb$: TiNNb prepared in same conditions, 10 nm Au SS is 10 nm gold on stainless steel, and EXG2 is conductive organic coating on stainless steel.

Figure 2:
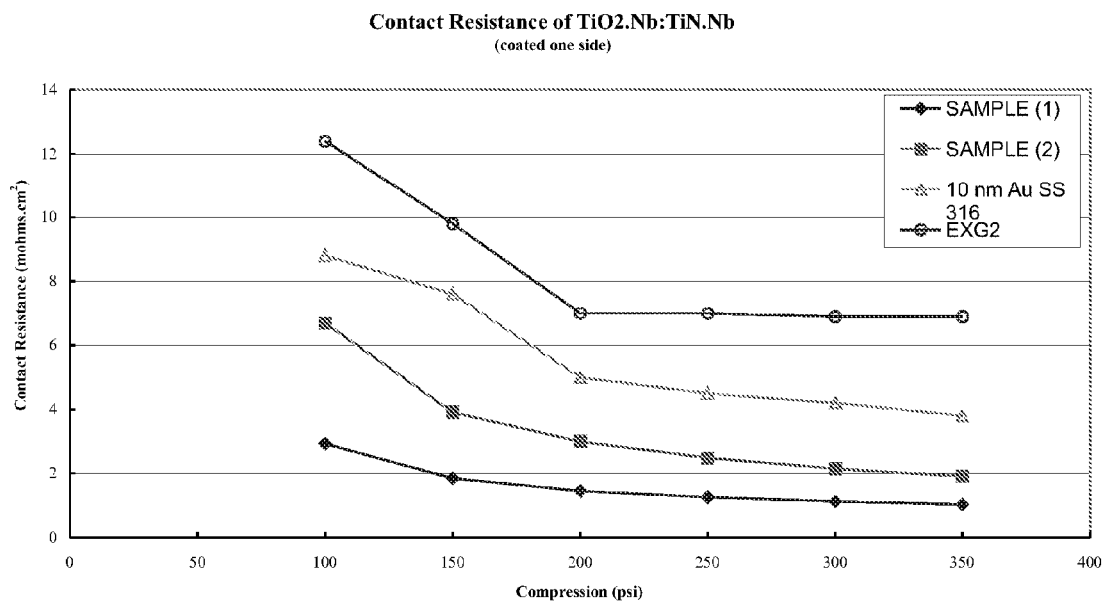
FIG. 2 is a variation of the contact angle and oxygen concentrations in titanium nitride.
Figure 3:
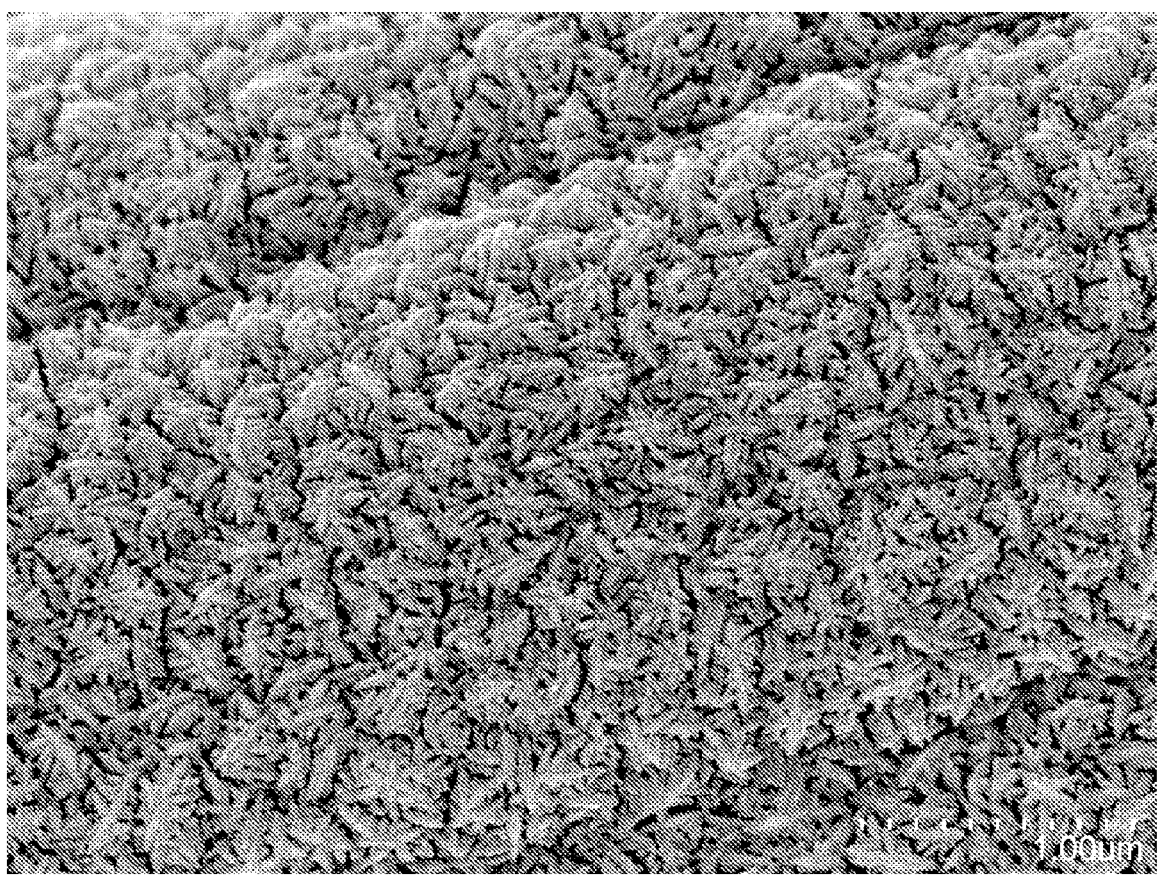
FIG. 3 is a SEM image showing the morphology of doped Titanium oxynitride $NbTiO_2$:NbTiN.
Figure 4:
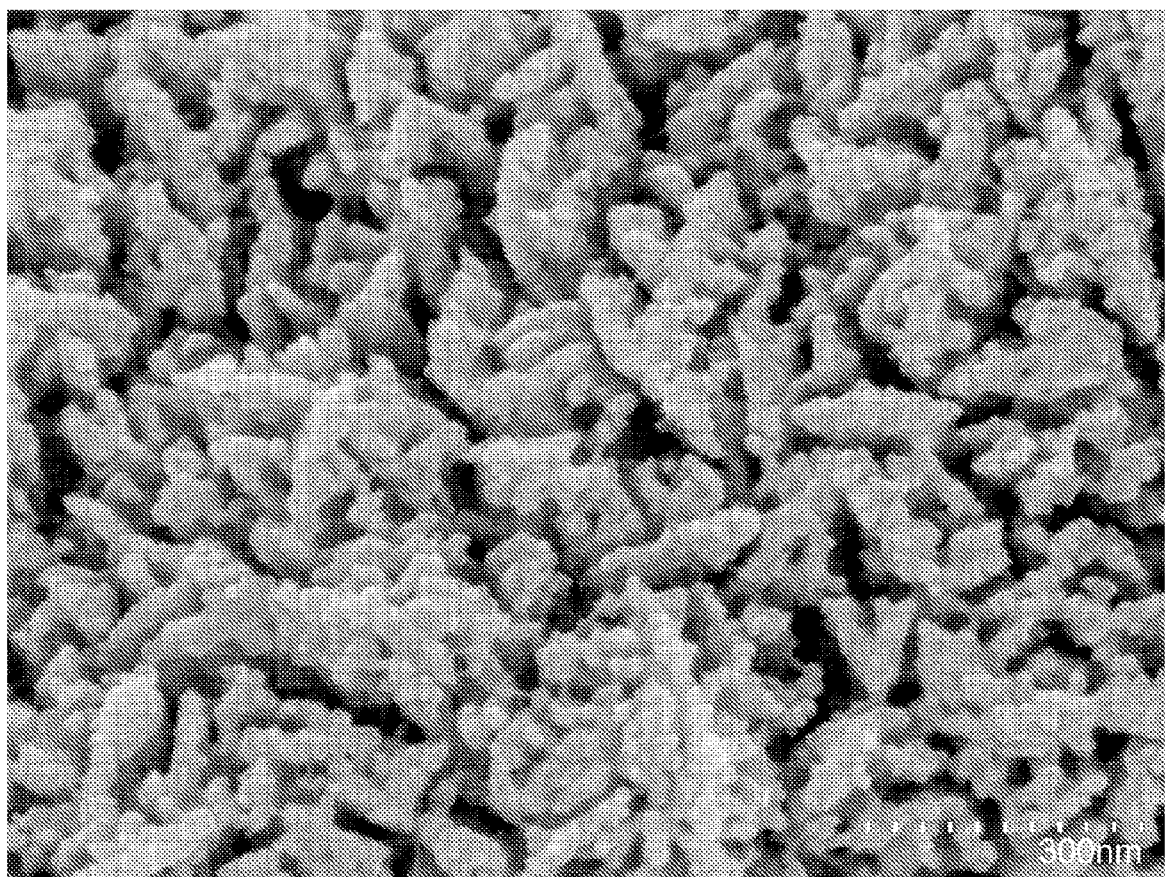
FIG. 4 is a high magnification SEM image showing the morphology of doped Titanium oxynitride $NbTiO_2$:NbTiN.

The contact angle measured for Sample 1 and Sample 2 (of FIG. 1) are between 5-20 degrees. These samples showed comparable hydrophilicity when compared to $SiO_x$ coatings. Also, the contact angle of mixed oxides depends on processing conditions mainly on the ratio of reactive gases to the metal ions. FIG. 2 shows that in the case of TiN the dependence is not monotonic and has a sharp minimum (12°) for $TiN_{0.8}O_{0.2}$ compound. Surface morphology of these coatings looks porous forming elongated platelets as shown in FIGS. 3 and 4.

Figure 5:
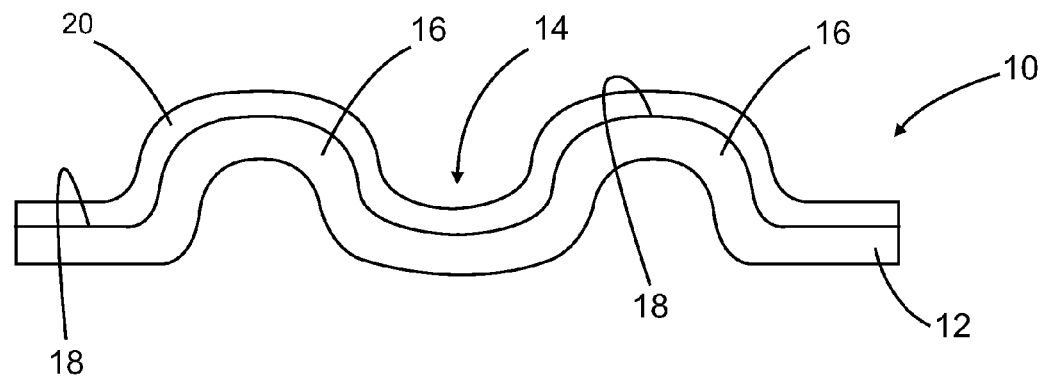
FIG. 5 is a sectional view of a fuel cell component having a coating thereon according to one embodiment of the invention.

Referring now to FIG. 5, one embodiment of the invention includes a fuel cell component 10 having a coating 20, as described above, thereon. As shown in FIG. 5 the fuel cell component may be a bipolar plate which includes a substrate 12 which may be of the type that has been stamped to define a gas flow field defined by a plurality of lands 16 and channels (through which the gases flow). The coating 20 may be deposited over an upper surface 18 of the bipolar plate. The coating may be deposited over the upper surface 18 before or after the substrate 12 has been stamped. The substrate 12 may be a metal such as, but not limited to, stainless steel.

Figure 6:
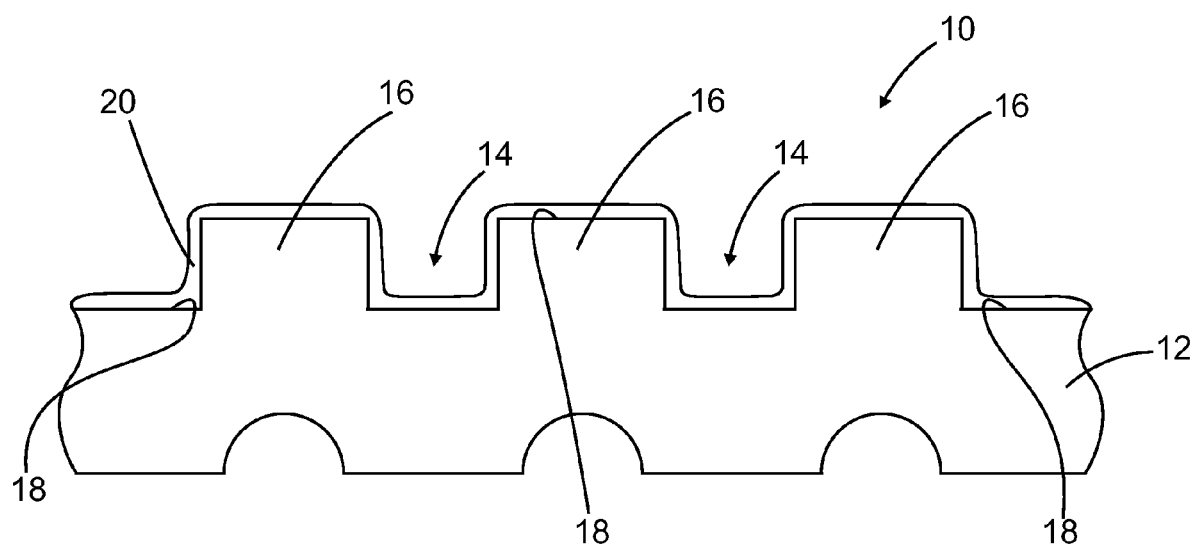
FIG. 6 is a sectional view of a fuel cell component having a coating thereon according to one embodiment of the invention.

Referring now to FIG. 6, another embodiment of the invention includes a fuel cell bipolar plate 10 including a substrate 12 that has been machined to define a gas flow field defined by a plurality of lands 16 and channels 14 (through which the gases flow). The coating 20 may be deposited over an upper surface 18 of the bipolar plate. The substrate 12 may be a metal such as, but not limited to, stainless steel.

Before the coating 20 is deposited over the upper surface 18 of the substrate 12, the substrate 12 (e.g., bipolar plate 10) may be cleaned by a suitable process, such as ion beam sputtering, pickling (with a solution of $HF+H_2SO_4$, or by cathodically cleaning to remove the resistive oxide film on the outside of the substrate 12 that may have formed. The coating 20 can be deposited over the bipolar plates 10 by any suitable technique including, but not limited to, physical vapor deposition processes, chemical vapor deposition (CVD) processes, thermal spraying processes, sol-gel, spraying, dipping, brushing, spinning on, or screen printing. Suitable examples of physical vapor deposition processes include electron beam evaporation, magnetron sputtering and pulsed plasma processes. Suitable chemical vapor deposition processes include plasma enhanced CVD and atomic layer deposition processes. CVD deposition processes may be more suitable for the thin film layers of the coating 20. The coating 20 may be deposited over the entire upper surface 18 of the substrate 12 including the area of the lands 16 and channels 14 in the case of a bipolar plate or the coating 20 may be selectively deposited.

This example describes a process for making one embodiment of the invention which includes a coating of $NbiTiO_2$: TiN:Nb on stainless steel (SS316L).

For depositing $TiO_2$:Nb; Prepare deposition furnace (Model TCD61-660 furnace with 3615 controller) set at 485° C. and the lines heated at 150° C. with purge and flow $N_2$ at 15-16 l/min. In about 4 hours its condition becomes stable.

Prepare Precursor: In glove box mix −$Nb(OEt)_5$ Niobium ethoxide 11.8% in volume +2-cyclohexon-1-one 11.8% in volume +Titanium isopropoxide 76.4% in volume. Put the solution in a syringe and connect syringe to atomizing nozzle and prefill it.

Prepare and Clean SS (stainless steel) substrate by etching in $1MH_2SO_4+0.1$ M HF solution at 80° C. for 2 minutes. Put the SS substrate in the substrate holder and make the substrate surface flat to the substrate holder to avoid edge effect. Preheat, put the prepared substrate and holder in furnace to the preheat position for <25 min.

Deposition: Using the syringe pump speed of 0.16-20 ml/min and the atomizer power to 2.5 W with $N_2$ flow at 10 L/min and closing the purge lines and set the exhaust line to about ~20 1/min keeping the furnace moving belt speed 4(~4.5"/min). The precursor volume 0.8-0.95 ml. Finish deposition of $TiO_2$:Nb and take out sample holder and moving SS sample to Aluminum plate as soon as possible for a faster cooling down.

Conversion film from $TiO_2iNb$ to $TiO_xN_y$:Nb: Put sample in tube furnace then flow $H_2$ 10% in $N_2$ gas at room to 90° C. for>1 hr. Set furnace at 86° C. continue flow $H_2$ 10% in $N_2$ gas. When furnace>85° C. start timer, keep 85°-87° for 45 min. Turn off furnace, keep flow $H_2$ 10% in $H_2$ gas cooling down as soon as possible to <60° C. Stop the flow, take out samples.

One embodiment of the invention includes a process comprising: place a fuel cell bipolar plate in a chemical vapor deposition chamber; flowing a first precursor and a second precursor into a chemical vapor deposition chamber, wherein the first precursor comprises an organic or inorganic derivative of Ti, and the second precursor comprises an organic or inorganic derivative of Nb so that a first coating is formed on the plate comprising Ti and Nb; heating the plate to a temperature ranging from 500-900° C. in the presence of nitrogen to convert the first coating to a second coating comprising Ti, $N_b$ and N.

Another embodiment of the invention includes a process comprising: placing a fuel cell bipolar plate in a chemical vapor deposition chamber; flowing a first precursor and a second precursor into a chemical vapor deposition chamber, wherein the first precursor comprises an organic or inorganic derivative of at least one of Ti, Zr, V, Nb, or Ta, and the second precursor comprises an organic or inorganic derivative of at least one of Ti, Zr, V, Nb, or Ta so that a first coating is formed on the plate comprising a binary or ternary compound, a binary or ternary nitride or a binary or ternary oxide. Another embodiment of the invention includes a process comprising: placing a fuel cell bipolar plate in a chemical vapor deposition chamber; flowing a first precursor and a second precursor into a chemical vapor deposition chamber, wherein the first precursor comprises an organic or inorganic derivative of at least one of Ti, Zr, V, Nb, or Ta, and the second precursor comprises an organic or inorganic derivative of at least one of Ti, Zr, V, Nb, or Ta; heating the plate to a temperature ranging from 500-900° C. in the presence of nitrogen to convert the first coating to a second coating a nitride compound.

When the terms "over", "overlying", "overlies" or the like are used herein with respect to the relative position of layers to each other such shall mean that the layers are in direct contact with each other or that another layer or layers may be interposed between the layers.

The above description of embodiments of the invention is merely exemplary in nature and, thus, variations thereof are not to be regarded as a departure from the spirit and scope of the invention.

What is claimed is:

1. A product comprising:

a fuel cell component comprising a bipolar plate and an electrically conductive hydrophilic coating deposited on at least a portion of the bipolar plate, and wherein the coating comprises at least one TiHfN, NbTiN, NbHfN, TaHfN, TaZrN, $NbTiO_xN_y$, or $TaZrO_xN_y$, where $0.001 \leq x \leq 1$, and $0.1 \leq y \leq 2$.

the coating making the bipolar plate resistant to corrosion during fuel cell operation due to fluoride ions being released as a product of membrane degradation.

2. A product as set forth in claim 1 wherein the coating has a contact resistance equal to or less than 10 nm Au.

3. A product as set forth in claim 2 wherein the bipolar plate comprises stainless steel.

4. A process comprising:

providing a fuel cell component comprising a bipolar plate;

forming an electrically conductive hydrophilic coating over at least a portion of the bipolar plate, and wherein the coating comprises at least one of TiHfN, NbTiN, NbZrN, NbHfN, TaHfN, TaZrN, $NbTiO_xN_y$, $TiZrO_xN_y$, where $0.001 \leq x \leq 1$, and $0.1 \leq y \leq 2$, the coating making the bipolar plate resistant to corrosion during fuel cell operation due to fluoride ions being released as a product of membrane degradation.

5. A product as set forth in claim 4 wherein the fuel cell component comprises a bipolar plate.

6. A product as set forth in claim 5 wherein the bipolar plate comprises stainless steel.

7. A process as set forth in claim 4 wherein the forming an electrically conductive hydrophilic coating over the bipolar plate comprises depositing a material by physical vapor deposition, depositing a material by chemical vapor deposition, thermal spraying processes, sol-gel deposition, spraying, dipping, brushing, spinning on, or screen printing.

8. A process as set forth in claim 6 wherein the forming an electrically conductive hydrophilic coating over the bipolar plate comprises depositing a material by physical vapor deposition, chemical vapor deposition, thermal spraying, sol-gel deposition, spraying, dipping, brushing, spinning on, or screen printing.

* * * * *